United States Patent [19]
Gardner et al.

[11] Patent Number: 6,005,285
[45] Date of Patent: Dec. 21, 1999

[54] ARGON DOPED EPITAXIAL LAYERS FOR INHIBITING PUNCHTHROUGH WITHIN A SEMICONDUCTOR DEVICE

[75] Inventors: Mark I. Gardner, Cedar Creek; H. Jim Fulford, Jr., Austin, both of Tex.; Charles E. May, Gresham, Oreg.

[73] Assignee: Advanced Micro Devices, Inc., Sunnyvale, Calif.

[21] Appl. No.: 09/205,321

[22] Filed: Dec. 4, 1998

[51] Int. Cl.[6] ................................................ H01L 29/36
[52] U.S. Cl. ............................ 257/607; 257/611; 438/526
[58] Field of Search ................................ 257/607, 611, 257/612, 617; 438/543, 528, 526

[56] References Cited

U.S. PATENT DOCUMENTS

| | | | |
|---|---|---|---|
| 4,956,693 | 9/1990 | Sawahata et al. | 257/611 |
| 5,384,477 | 1/1995 | Bulucea et al. | 257/376 |
| 5,518,943 | 5/1996 | Tsunoda | 437/43 |
| 5,723,896 | 3/1998 | Yee et al. | 257/499 |
| 5,747,371 | 5/1998 | Robb et al. | 438/273 |

*Primary Examiner*—David B. Hardy
*Attorney, Agent, or Firm*—Kevin L. Daffer; Conley, Rose & Tayon

[57] ABSTRACT

A fabrication process and transistor are described in which a transistor having decreased susceptibility to punchthrough and increased resistance to impurity diffusion is formed. One or more argon doped silicon epitaxial layers are formed superjacent a semiconductor substrate. In a preferred dual layer embodiment, a first argon doped silicon epilayer is grown over a substrate, and a second argon doped epilayer, preferably having an argon concentration less than that in the first epilayer, is formed over the first epilayer. A transistor is formed in an active region of a well having a channel laterally bounded by source/drain regions located exclusively in the second epilayer. The lighter argon doping of the second epilayer accommodates current flow in the channel while acting as a barrier to impurity outdiffusion and inhibiting punchthrough. The more heavily doped first epilayer serves primarily as a barrier to outdiffusion of impurities from the bulk substrate.

14 Claims, 3 Drawing Sheets

ARGON DOPED EPITAXIAL LAYERS FOR INHIBITING PUNCHTHROUGH WITHIN A SEMICONDUCTOR DEVICE

BACKGROUND OF THE INVENTION

1. Field of the Invention

This invention relates generally to the fabrication of integrated circuits and more particularly to providing an improved substrate for enhanced transistor operation by growing one or more argon doped epitaxial layers upon a bulk semiconductor substrate.

2. Description of the Related Art

MOS ("metal oxide semiconductor") transistors are the basic building blocks of integrated circuits. Fabrication of MOS transistors is well known. Generally speaking, MOS transistors are manufactured by placing undoped polycrystalline silicon ("polysilicon") over a relatively thin gate oxide. The polysilicon material is then patterned to form a gate conductor directly above a channel region of the substrate. A dopant species is implanted into the gate conductor and regions of the substrate exclusive of the channel region, thereby forming source and drain regions adjacent to and on opposite sides of the channel region. For a p-type substrate, an n-type dopant is used for source and drain regions, and the resulting transistor is an NMOS ("n-channel") transistor device. Conversely, for an n-type substrate, the dopant species is p-type, and the resulting transistor is a PMOS ("p-channel") transistor device. Integrated circuits may utilize either n-channel devices exclusively, p-channel devices exclusively, or a combination of both on a single substrate.

Complementary MOS ("CMOS") circuits are one class of devices featuring both p-type and n-type MOS transistors on the same substrate. CMOS technology is prevalent in VLSI design because it offers a lower power alternative to either PMOS or NMOS circuits. Several CMOS structures have been used to allow PMOS and NMOS transistors to share a common substrate including p-well, n-well, twin tub, and silicon on insulator ("SOI"). In a typical n-well CMOS fabrication, the starting point is a lightly doped p-type substrate. An n-well region is created in the p-type substrate by implantation or deposition and diffusion. Implantation is used to form shallow wells appropriate for fine dimension processes. Since implantation of the n-type species does not generally position the implant to the desired depth, a subsequent high temperature cycle is needed to drive the impurities to the required depth. Redistribution of the well dopant proceeds both vertically and laterally. The lateral spread determines the spacing between the well and other structures. Lateral diffusion increases for deeper implants, which is one reason why shallow well implants are utilized for fine line geometries. After well formation, the remaining steps in a CMOS process flow are similar to normal NMOS and PMOS fabrication techniques. Namely, p-channel devices will be built in the n-well, and n-channel devices will be built in the p-substrate.

One problem shared by all MOS transistor devices is unwanted impurity diffusion. As is well known in the art, impurities are used to augment carrier transport and electrical performance in transistors. Controlled diffusion of impurities can be an important step in a process flow. Thus, thermal diffusion is often required subsequent to ion implantation in order to activate the dopants and repair lattice damage. However, unwanted migration or diffusion can occur during processing or transistor operation that degrades performance. For example, consider a CMOS device with a p-type substrate having a PMOS transistor formed in an n-well. A common p-type impurity for doping the substrate is boron, which is the fastest diffusing of the substitutional impurities. During various thermal cycles in the CMOS process flow, unwanted diffusion of boron from the substrate may occur, which inhibits device performance.

Another common problem encountered in transistors and CMOS devices is punchthrough. While in operation, transistors that have heavily doped source and drain regions arranged laterally adjacent the gate conductor often experience a problem known as punchthrough, which can lead to an undesirable increase in the subthreshold current, $I_{Dst}$. Punchthrough occurs when the voltage on the drain is increased with respect to the source, leading to a widening of the depletion region around the drain. The drain depletion region may eventually merge into the source depletion region, thereby reducing the potential energy barrier of the source-to-body junction, or the source-to-well junction for a transistor formed in a well. As a result, more majority carriers in the source region will have sufficient energy to overcome the barrier, causing an increased source-to-body current flow. For a device formed in a well, the increase would be in the source-to-well current flow. Collection of some of this current by the drain leads to an increase in $I_{Dst}$. Likewise, vertical punchthrough can occur if the depletion region of the source/drain-to-well junction were to contact the depletion region of the well-substrate junction.

To prevent short-channel devices from entering punchthrough, the substrate doping may be increased to decrease the depletion-layer widths extending into the substrate. For many long-channel devices, a single implant may serve as both a punchthrough stop and a $V_T$ adjust. In cases where a single implant is inadequate, such as in submicron MOS transistors, a second, deeper implant may be provided. The punchthrough stop may be implanted such that its peak concentration is located at a depth near the bottom of the source and drain regions. This additional doping advantageously reduces the lateral widening of the drain depletion region below the substrate surface.

More advanced transistors and CMOS devices have been achieved by reducing device geometries, such as channel length and source/drain depth. Commensurate with minimizing device dimensions is the need for lower values of $V_T$, the threshold voltage. As a result, punchthrough creeps up to the $V_T$ region of the silicon. This in turn translates into scaling down the depth of the punchthrough stop. However, the proximity of the punchthrough stop to the $V_T$ region may lead to an increase in $V_T$, which is undesirable in modern devices. The competition between the desire to scale down device dimensions versus the need to inhibit punchthrough effectively limits the degree of scaling possible with known techniques. Therefore, it would be highly desirable to reduce punchthrough effects in transistors in a manner that does not limit scaling of device dimensions. This would allow the formation of shallower wells by preventing vertical punchthrough, and simultaneously allow smaller values of $V_T$ to maximize device performance.

Transistors and CMOS devices can also be fabricated using a silicon substrate having an epitaxial layer on the upper surface of the substrate. Epitaxy is a method of growing a single crystal thin film on the surface of a single crystal substrate. Currently, both n-epi on $n^+$ substrates and p-epi on $p^+$ substrates are utilized, with each method having advantages and drawbacks. Because of problems with n-epi on $n^+$ substrates tend to be more serious, p-epi on $p^+$ substrates is more widely used. The major limitation of the latter approach is that the diffusion of boron from the $p^+$ substrate is much more severe than in the case of n-epi on n+. Thus, according to conventional CMOS technology, the thickness of the epitaxial layer is greater than the well depth since the dopants in the heavily doped substrate under the epitaxial layer diffuse toward the surface as the well dopants are diffused toward the bulk. These diffusion effects are taken into account by using a thicker p-epitaxial layer so that the bottom of the well is eventually located adjacent to the upper surface of the heavily doped substrate. It would be advantageous to have a CMOS transistor with a thinner epitaxial layer.

SUMMARY OF THE INVENTION

The problems outlined above are largely solved by fabricating transistors having one or more argon doped silicon epitaxial layers grown upon a semiconductor substrate. The presence of argon in an epi layer will limit the outdiffusion of impurities such as boron, which is a common dopant species for p-type substrates and $V_T$ adjust implants. Sufficiently high concentrations can also negatively effect current flow in the transistor channel. Therefore, a preferred embodiment features a first argon doped silicon epitaxial layer having a higher argon concentration than a superjacent second argon doped silicon epi layer. This dual layer embodiment allows for a lightly doped second epi layer to accommodate carrier (i.e., current) flow in the channel while allowing for a heavily doped first epi layer to minimize outdiffusion of boron from the substrate. An argon doped silicon epi layer also is believed to reduce punchthrough susceptibility, thereby substantially eliminating the need for a punchthrough stop in PMOS embodiments.

Broadly speaking, one embodiment contemplates a transistor having an argon doped silicon epitaxial layer superjacent a semiconductor substrate. A preferred embodiment features an epitaxial layer, or epi layer, comprising at least two argon doped silicon epitaxial layers. This multi-layer embodiment includes a first argon doped silicon epitaxial layer having a first argon concentration subjacent a second argon doped silicon epitaxial layer having a second argon concentration, wherein the first argon concentration is greater than said second argon concentration. Further elements of a preferred transistor include a well formed in the argon doped silicon epitaxial layer, wherein the upper surface of the well coincides with the uppermost surface of the epi layer. In the case of a single epi layer, the well may extend below the lower surface of the epi layer. A preferred embodiment aligns the bottom of the well with the lower surface of the epi layer. For an epi multi-layer, several well orientations are possible. In one embodiment, the well extends to the lower surface of the first, i.e. the lowest, epi layer. Alternatively, the well may reside in the first epi layer, but above the lower surface of the first epi layer. Yet another alternative positions the well exclusively within the second epi layer. Within an active region of the well, a gate conductor is arranged a dielectric spaced distance above the argon doped silicon epitaxial layer. According to one embodiment, the transistor may also include a $V_T$ adjust implant located in the channel region under the gate conductor. The transistor may also include a punchthrough stop residing in the epi layer located within the active region of the well, wherein the gate conductor is substantially centered over the punchthrough stop. In one embodiment, the lateral dimension of the punchthrough stop may be aligned with the gate conductor width.

In a preferred embodiment, the transistor is a CMOS device having a p+-type silicon substrate, wherein the p-type dopant is boron. The epitaxial layer can include p-type silicon, wherein the p-type dopant concentration is less than the concentration in the substrate. Alternatively, the epitaxial layer can include p−-type silicon. An n-well is formed with the bottom of the well preferably aligned with the lower surface of the lowest epi layer. A gate conductor is arranged upon in the n-well a dielectric spaced distance above the uppermost epi layer. LDD and source/drain regions are located in the uppermost epi layer adjacent to opposite sides of the gate conductor, with the source/drain regions being spaced distance from the opposing sidewalls of the gate conductor. A $V_T$ adjust implant may reside just below the upper surface of the uppermost epi layer. A punchthrough stop may be located under the gate conductor preferably at a depth intermediate between the depth of the source/drain regions and the lower surface of the uppermost epi layer, and more preferably at depth near the bottom of the source/drain regions.

A method is further contemplated for forming a transistor including growing an argon doped silicon epitaxial layer upon a semiconductor substrate. Growing an argon doped silicon epitaxial layer entails introducing a mixed gas into a deposition chamber, wherein the mixed gas includes a silicon source gas and an argon source gas. The silicon source gas can include silicon tetrachloride ($SiCl_4$), trichlorosilane ($SiHCl_3$), dichlorosilane ($SiH_2Cl_2$), silane ($SiH_4$), or mixtures of these gases. More generally, the argon doped silicon epitaxial layer can be a multi-layer. In a preferred embodiment, the number of layers is two. Growing this dual-layer embodiment can be accomplished by introducing a first mixed gas into a deposition chamber for a first duration, wherein the first mixed gas includes a first silicon source gas and a first argon source gas. This results in a first argon doped silicon epitaxial layer being grown superjacent the semiconductor substrate. Next, a second mixed gas is introduced into the deposition chamber for a second duration commencing after the first duration, wherein the second mixed gas includes a second silicon source gas and a second argon source guess having an argon concentration less than the first argon source gas. In this way, a second argon doped silicon epitaxial layer is grown over the first argon doped silicon epitaxial layer. Typically, the first and second silicon source gas will be the same. A preferred material for the semiconductor substrate is p+-type silicon, and the epitaxial layer or layers suitably include p-type or p−-type silicon.

A further step may include implanting an impurity distribution into the epitaxial layers to form a well region therein. Wells are typically used in CMOS devices. Generally, the well regions have opposite doping type than the substrate. In the case where the semiconductor substrate is p+-type silicon and the epi layers are p-type or p−-type silicon, the well is formed by forwarding an n-type impurity distribution into the argon doped silicon epitaxial layer. In a conventional CMOS process, the thickness of the epi layer is greater than the well depth, since the impurities in heavily doped substrate diffuse toward the surface as the well dopants are diffused toward the bulk. By accounting for this diffusion in a conventional CMOS process, the process can be designed so that the bottom of the well is eventually adjacent to the upper surface of the substrate. However, the argon distribution in the epi layers serves as a barrier to diffuision of impurities such as boron from the substrate. Therefore, using the disclosed method it is possible to position the well bottom without regard to outdiffusion. In the single layer embodiment, the well extends to the lower surface of the argon doped silicon epitaxial layer. In the dual-layer embodiment, the well may extend through the second epi layer into the first epi layer, which is the lower of the two epi layers, in which case the well ideally extends to the lower surface of the first epi layer. Alternatively, the well may be located exclusively within the second epi layer, in which case the well bottom is preferably aligned with the lower surface of the second epi layer. Subsequent steps may include formation of a gate conductor, LDD regions, and source/drain regions in the active region of the well.

Another embodiment features implanting a punchthrough stop into a patterned area of the active region of the well located near the bottom of the source/drain regions. A further step includes patterning a gate conductor and a subjacent gate dielectric upon the epi layer, or the second epi layer in the dual-layer embodiment. In an embodiment featuring a punchthrough stop, the gate is preferably arranged substantially centered over the punchthrough stop. The dopant species utilized in the punchthrough stop is chosen to match the dopant type of the well. For an n-well formed in a p type epi layer, the punchthrough will be an n-type species, while a p-type species is used for the punchthrough stop in a p-well formed in an n-type epi layer. One advantage of the presently disclosed method is that the argon doped silicon epitaxial layer will reduce punchthrough susceptibility. Use of an argon doped silicon epi layer formed according to the disclosed method inhibits punchthrough in PMOS devices to greater extent than in NMOS devices. Therefore, a punchthrough stop may be included in a PMOS embodiment; however, a punchthrough stop is more suitably included in an n-channel device. The lateral dimension of the punchthrough stop is preferably equal to or less than the width of the gate conductor. In a dual-layer embodiment, the punchthrough stop is ideally located in the first argon doped silicon epitaxial layer.

Yet another embodiment includes performing a $V_T$ adjust implant subsequent to forming well region and prior to forming a gate conductor and source/drain regions. A $V_T$ adjust is optional and may be used to precisely control the threshold voltage of the transistor. In one embodiment, boron is implanted through a sacrificial layer into the uppermost epi layer, with the peak boron concentration lying just below the upper surface of the uppermost epi layer.

BRIEF DESCRIPTION OF THE DRAWINGS

Other objects and advantages of the invention will become apparent upon reading the following detailed description and upon reference to the accompanying drawings in which.

Figure 1:
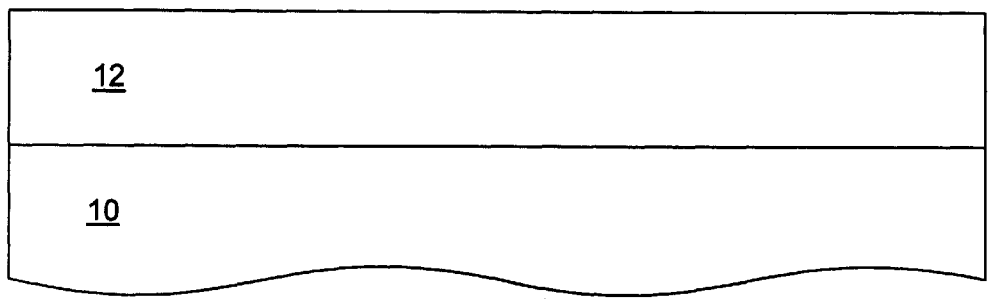
FIG. 1 depicts a partial cross-sectional view of a semiconductor topography of a preferred embodiment wherein a first argon doped silicon epitaxial layer is formed over a semiconductor substrate.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Turning now to the drawings, FIG. 1 shows first argon doped silicon epitaxial layer 12 (alternatively referred to herein as first epi layer 12) formed over semiconductor substrate 10. Semiconductor substrate 10 may be n-type or p-type single crystal silicon but is preferably $p^+$-type silicon. If semiconductor substrate 10 is $p^+$-type silicon, first epi layer 12 may include p-type or $p^-$-type silicon. Boron is a suitable dopant species for both substrate 10 and first epi layer 12.

First argon doped silicon epitaxial layer 12 is preferably formed using a chemical vapor deposition (CVD) system. Semiconductor substrate 10 is placed in a deposition chamber of the CVD system. Next, a first mixed gas is introduced into the deposition chamber for a first duration. The first mixed gas includes a first silicon source gas and a first argon source gas. The deposition is preferably performed at a temperature between about 950° C. to about 1250° C. The first silicon source gas may be silicon tetrachloride ($SiCl_4$), trichlorosilane ($SiHCl_3$), dichlorosilane ($SiH_2Cl_2$), silane ($SiH_4$), or mixtures of these gases. Under these conditions first argon doped silicon epitaxial layer 12 is formed having argon atoms incorporated into the epitaxial layer.

An advantage of epitaxial growth over ion implantation is that the thickness of the doped layer may be readily controlled. When ion implantation is used to insert argon atoms into dielectric layers, the depth of the implantation may be difficult to control due to the high energy required to achieve argon ionization. The formation of an argon doped silicon epitaxial layer allows the location, as well as the concentration, of the barrier atoms to be precisely controlled at a predetermined depth.

Figure 2:
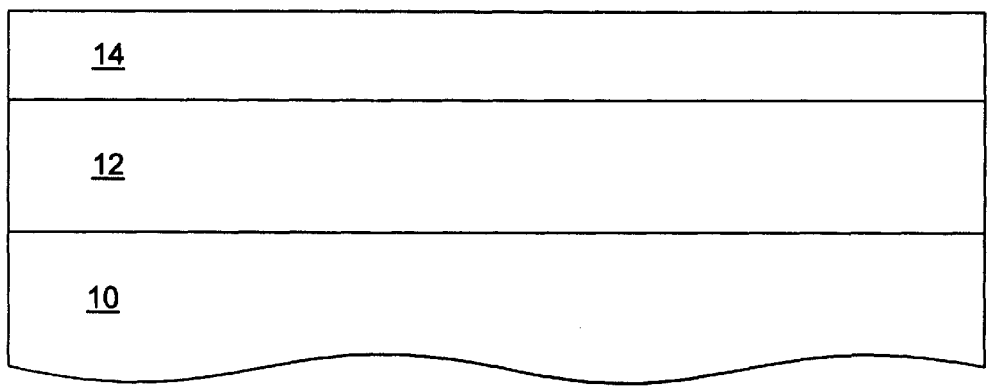
FIG. 2 depicts a partial cross-sectional view of the semiconductor topography wherein a second argon doped silicon epitaxial layer is formed over the first argon doped silicon epitaxial layer.

Referring to FIG. 2 a subsequent step in a dual-layer embodiment is illustrated, whereby second argon doped silicon epitaxial layer 14 (alternatively referred to herein as second epi layer 14) is formed over first argon doped silicon epitaxial layer 12. Second epi layer 14 is grown by introducing a second mixed gas into the deposition chamber for a second duration commencing after the first duration, wherein the second mixed gas includes a second silicon source gas and a second argon source gas. The second silicon source gas may be silicon tetrachloride ($SiCl_4$), trichlorosilane ($SiHCl_3$), dichlorosilane ($SiH_2Cl_2$), silane ($SiH_4$), or mixtures of these gases. The composition of the second silicon source gas preferably matches the first silicon source gas. The concentration of argon in the first mixed gas is greater than the concentration of argon in the second mixed gas. This results in second epi layer 14 being more lightly doped than first epi layer 12. The presence of the argon in the epi layers acts as a barrier to boron diffusion from the substrate. However, if the argon concentration is too great charge transport may be adversely effected. This is undesirable in second epi layer 14, because the transistor channel will eventually be formed in this layer. Hence, a lower argon concentration is preferred in second epi layer 14. On the other hand, current flow outside the channel is unwanted. Therefore, a higher argon concentration is preferred in first epi layer 12. Doping the first and second epi layers with argon also will benefit transistor performance by limiting punchthrough as discussed in more detail below.

Figure 3:
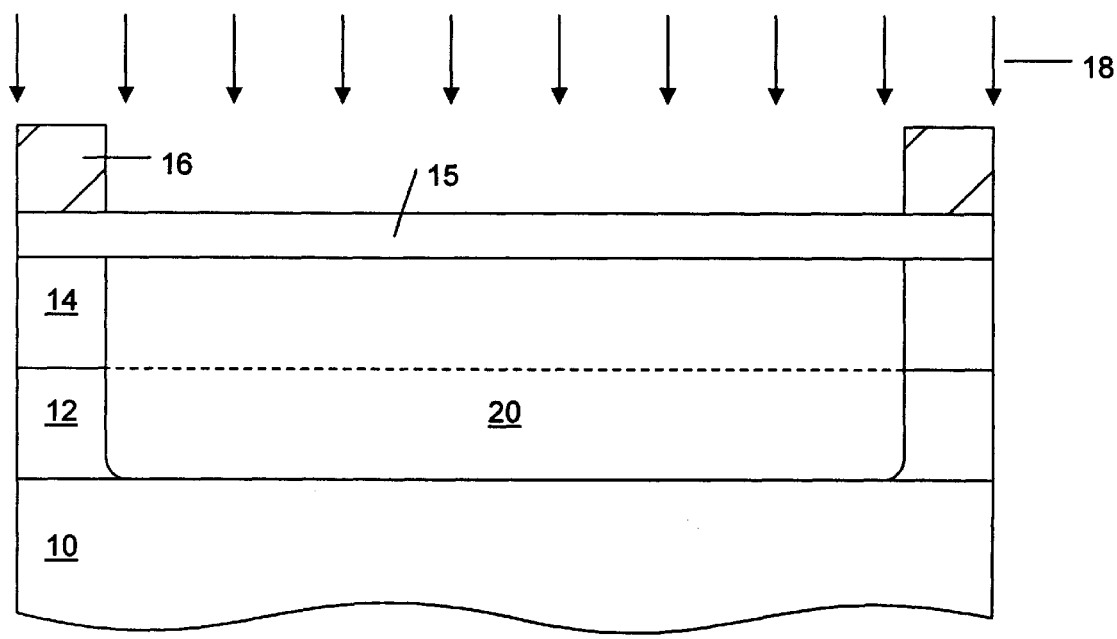
FIG. 3 depicts a partial cross-sectional view of the semiconductor topography wherein a well is formed in the first and second argon doped silicon epitaxial layer by implanting an impurity distribution through a first masked sacrificial layer.

Moving to FIG. 3, sacrificial layer 15 is formed on the upper surface of second epi layer 14. Sacrificial layer 15 may include silicon dioxide grown upon second epi layer 14. Following the formation of sacrificial layer 15, a photoresist layer is deposited, patterned, and removed to form mask 16, thereby exposing unmasked portions of sacrificial layer 15. Well implant 18 forwards an impurity distribution through sacrificial layer 15 leading to the formation of well region 20. Implanting well regions into a substrate is a well-known step in the fabrication of CMOS devices. Use of wells allows both NMOS and PMOS transistors to be made in a common substrate. The formation of CMOS devices on epitaxial substrates is also known to prevent latchup. In a typical case, a heavily doped substrate with a more lightly doped epitaxial layer is used. Examples include p-epi on p$^+$ substrate and n-epi on n$^+$ substrate, with p-on-p$^+$ epi being more prevalent because it exhibits fewer drawbacks. The primary limitation encountered with p-on-p$^+$ epi stems from the outdiffusion of boron from the p$^+$ substrate. Dealing with this limitation in the past has required a thicker epi layer and a two step well formation process. Both of these requirements are avoided according to the disclosed embodiments. In the preferred case of a p-epi on p$^+$ substrate, well region 20 is an n-well. To form the n-well, the concentration of the n-type dopants must be greater than the highest concentration of the p-type dopants in regions intersecting well region 20.

In the case of a single well embodiment, the n-well may extend to the lower surface of the single argon doped silicon epitaxial layer. In another single layer embodiment, the well extends into the single argon doped silicon epitaxial layer but does not reach the lower surface of the epi layer. For the dual-layer embodiment, more well positions are possible. Well region 20 may be located exclusively within second epi layer 14, in which case the bottom of well region 20 is preferably aligned with the lower surface of second epi layer 14, as illustrated by the dotted line in FIG. 3. Alternatively, well region 20 may extend through second epi layer 14 into first epi layer 12, which is the lower of the two epi layers, in which case the well bottom ideally extends to the lower surface of first epi layer 12, as shown in FIG. 3. According to conventional CMOS technology, two steps would be required to align the bottom of the well with the upper surface of the p$^+$ substrate. Initially, the epitaxial layer is made thicker than the well depth, since the boron in the p$^+$ substrate diffuse toward the surface as the well dopants diffuse toward the substrate. Accounting for this diffusion effect allows conventional CMOS processes to be designed so that the well bottom is eventually aligned with the upper surface of the substrate. By contrast, in the disclosed embodiments the argon in the epi layers acts as a barrier to boron outdiffusion from the heavily doped substrate, thereby substantially eliminating the need for a diffusion step to align the well bottom with the lower surface of the epi layer. In addition, outdiffusion of boron from the p$^+$ substrate meant thicker epi layers were needed in conventional epi-CMOS devices. This is no longer the case with the argon doped silicon epi layers disclosed herein.

Figure 4:
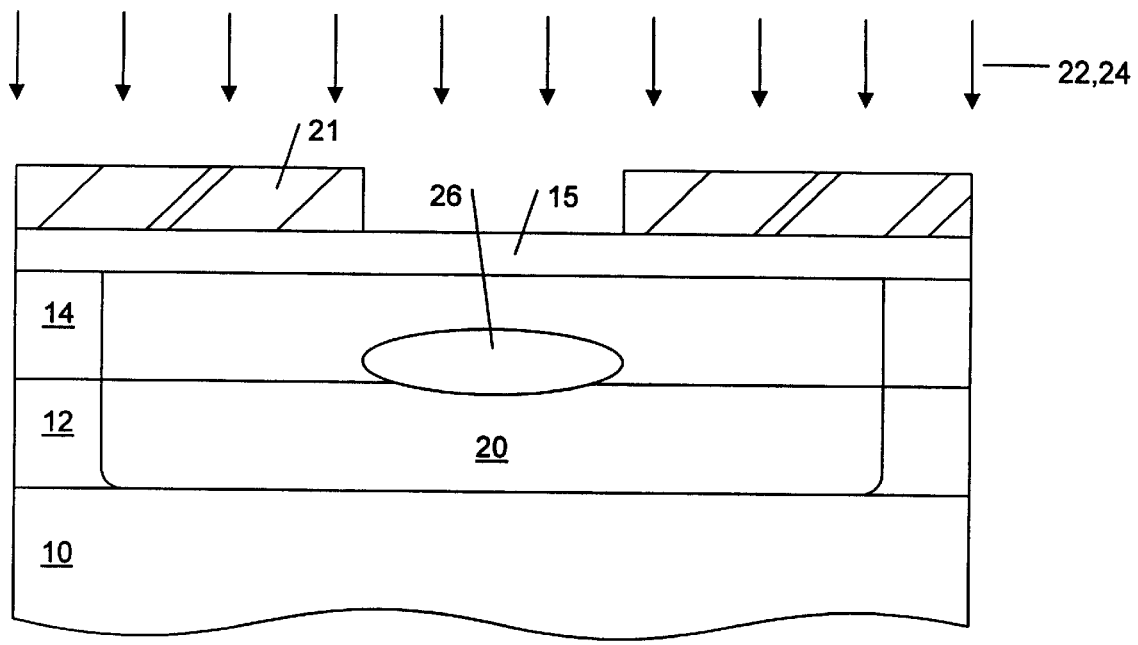
FIG. 4 depicts a partial cross-sectional view of the semiconductor topography wherein a threshold adjust implant and a punchthrough stop implant are forwarded into the epi layers using a second masked sacrificial layer.

Turning to FIG. 4, mask 16 is removed and another layer of photoresist is deposited, patterned, and removed to form mask 21. Mask 21 aligns punchthrough implant 22 and V$_T$ adjust implant 24 through sacrificial layer 15. In one embodiment, V$_T$ adjust implant 24 may be performed to allow doping of second epi layer 14 with boron. The peak concentration of the implant is preferably just below the upper surface of second epi layer 14. As a result of implanting boron into the channel region of the n-well, V$_T$ becomes less negative. One advantage of the disclosed method for V$_T$ adjust implants is that argon will prevent significant outdiffusion of boron from the resultant boron adjust layer, thereby allowing for the formation of shallower boron adjust layers. A shallower adjust layer may improve device performance by reducing punchthrough susceptibility as discussed below. Similarly, a shallow boron implant into the p-substrate or p-well of an n-channel transistor makes V$_T$ more positive. The formation of V$_T$ adjust implants and punchthrough stops is generally known in the art.

Punchthrough implant 24 leads to the formation of punchthrough stop 26 in the argon doped silicon epitaxial layers. For a PMOS transistor to be formed in an active area of well region 20, the punchthrough implant preferably includes an n-type dopant. Punchthrough stop 26 is preferably located in second epi layer 14, and more preferably at a depth intermediate between the depth of the source/drain regions and the lower surface of second epi layer 14, and still more preferably near the bottom of the source/drain regions. Formation of the source/drain regions is discussed below. The lateral dimension of the punchthrough stop may be greater than the width of the gate conductor but is preferably equal to or less than the width of the gate conductor. The formation of punchthrough stops is generally known in the art.

According to the disclosed methods, punchthrough stop 26 is optional, especially in PMOS devices. Subthreshold leakage current due to punchthrough can be a significant problem in CMOS devices. Leakage current resulting from punchthrough flows below the surface beyond the control of the gate voltage. Punchthrough basically occurs when the potential between the source and body is lowered. Implanting boron into the channel to adjust the threshold voltage can increase punchthrough susceptibility by pushing the potential minimum further into the body or well. A typical solution for alleviating punchthrough in PMOS is to carry out a high energy n-type dopant implant below the channel region to absorb the drain voltage. Another solution focuses on ways to reduce the thickness of the boron layer resulting from a V$_T$ adjust implant to minimize the effects of boron diffusion. The presently disclosed method of using argon doped epi layers substantially eliminates both of these problems. First, the argon in the epi layers acts a barrier to boron diffusion, thereby allowing the formation of thinner boron adjust layers. Second, the argon doping in first epi layer 12 absorbs potential from the drain to reduce punchthrough susceptibility.

Figure 5:
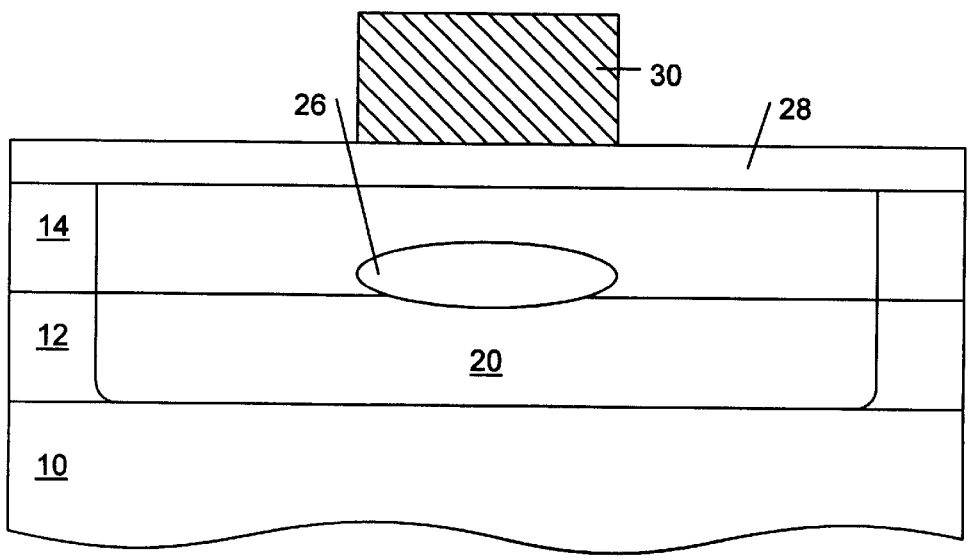
FIG. 5 depicts a partial cross-sectional view of the semiconductor topography wherein a gate conductor is arranged over the well region a dielectric spaced distance above the second epi layer.

FIG. 5 shows a processing step subsequent to FIG. 4 in which sacrificial layer 15 has been removed and gate dielectric layer 28 has been formed. Gate dielectric layer 28 may include a single layer of thermally grown silicon dioxide. Alternatively, gate dielectric layer 28 may include a single layer of silicon dioxide formed by deposition from a TEOS source or a silane and oxygen bearing source. Yet another possibility may be that gate dielectric layer 28 includes multiple layers, such as a silicon nitride layer deposited over an oxide layer.

Following the deposition of gate dielectric layer 28, gate conductor 30 is formed on top of gate dielectric layer 28. The formation of gate conductor 30 proceeds along well known steps. First, a layer of gate conductor material is deposited over gate dielectric layer 28. For example the layer of gate conductor material may include a chemical vapor deposition of polysilicon. An impurity distribution may be introduced into the layer of gate conductor material to adjust the resistivity of the gate conductor material. Impurities such as phosphorous, boron, or arsenic are commonly used for this purpose. The gate conductor layer is then patterned and portions are selectively removed leaving gate conductor 30. For example, a layer of photoresist may be patterned over the gate conductor layer and an anisotropic etch may then be used to selectively remove unexposed portions of the gate conductor layer. Gate conductor 30 is generally located in an active region of well region 20. In an embodiment including punchthrough stop 26, gate conductor 30 may be located substantially centered over punchthrough stop 26 as is shown in FIG. 5. In an alternative embodiment not shown, the gate dielectric layer may be left covering the entire semiconductor topography until LDD implants and source/drain implants are performed.

Figure 6:
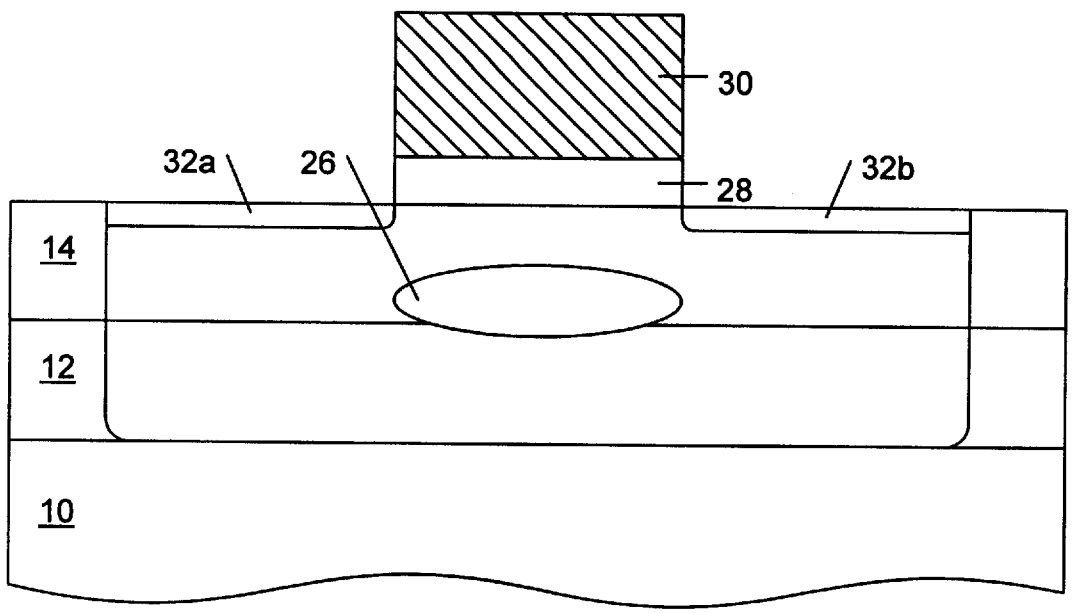
FIG. 6 depicts a partial cross-sectional view of the semiconductor topography wherein LDD regions are formed in the second epi layer adjacent to the gate conductor.

FIG. 6 depicts lightly doped source/drain (LDD) regions 32a and 32b formed on opposite sides of gate conductor 30. Gate conductor 30 serves as a mask for self-aligning an implant of either p-type or n-type dopants into the uppermost epi layer. Thus, in the dual-layer embodiment illustrated in FIG. 6, the dopants would be forwarded into second epi layer 14. In regions not covered by gate conductor 30, the dopant species is implanted into second epi layer 14 to a first dopant depth and a first dopant concentration. The first dopant depth and first dopant concentration is preferably chosen so that the regions being implanted form lightly doped drain (LDD) regions 32a and 32b. If the implant species is p-type, then preferably the dopant includes boron, and if the implant species is n-type, then the dopant preferably includes phosphorous or antimony. Thus, in a preferred embodiment in which semiconductor substrate 10 is p+-type silicon and well region 20 is an n-well, a p-type species may be used. Preferably this p-type species includes boron. It is noted that the argon dopant concentration in second epi layer 14 is less than in first epi layer 12 in order to achieve a balance between preventing diffusion of boron out of LDD regions 32a and 32b and maintaining a viable channel current. In regions where current is not wanted, such as in first epi layer 12, the argon concentration may be substantially higher.

Figure 7:
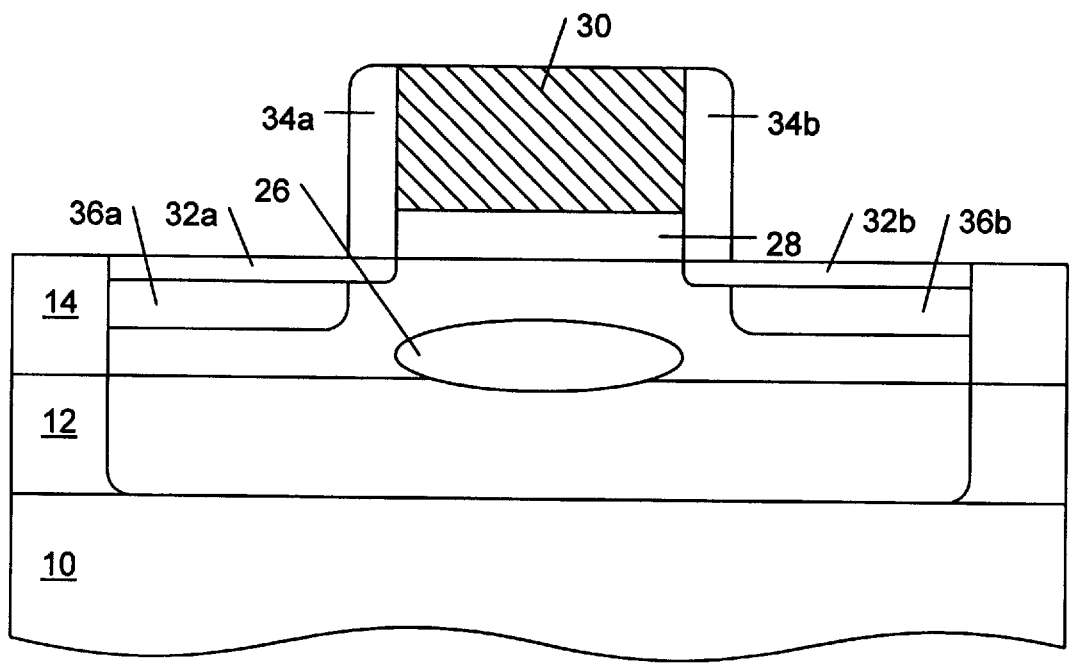
FIG. 7 depicts a partial cross-sectional view of the semiconductor topography in which opposed sidewall spacers are used to form source/drain regions in the second epi layer.

FIG. 7 shows the location of source and drain regions in a dual layer embodiment. Following the removal of oxide mask 72, a spacer material is conformally deposited over the entire semiconductor topography of FIG. 6, including gate conductor 30 and the areas overlying LDD regions 32a and 32b. The spacer material then undergoes an anisotropic etch to form spacers 34a and 34b on opposed sidewalls of gate conductor 30. After formation of spacers 34a and 34b, source/drain regions 36a and 36b are formed by implanting either n-type or p-type species into the uppermost epi layer, which in the illustrated embodiment is second epi layer 14. During source/drain implants, gate conductor 30 and spacers 34a and 34b serve as a mask. The source/drain implants are of the same species as the LDD implants; however, the source/drain implants are of a greater dopant concentration and implanted to a greater depth than the LDD implants. For an NMOS device, the LDD and source/drain implants are n-type; whereas, a PMOS device uses p-type LDD and source/drain implants. Thus, in an embodiment in which well region 20 is an n-well, p-type impurities are used in LDD regions 32a and 32b and source/drain regions 36a and 36b to form a PMOS device in well region 20.

What is claimed is:

1. A semiconductor device comprising an argon doped silicon epitaxial layer superjacent a semiconductor substrate, wherein said argon doped silicon epitaxial layer comprises a first argon doped silicon epitaxial layer having a first argon concentration subjacent a second argon doped silicon epitaxial layer having a second argon concentration.

2. The device of claim 1, further comprising a well formed in said argon doped silicon epitaxial layer and a gate conductor arranged over an active region of said well.

3. The device of claim 2, further comprising a punchthrough stop residing in said argon doped silicon epitaxial layer located within said active region, wherein said gate conductor is substantially centered over said punchthrough stop.

4. The device of claim 3, wherein the lateral dimension of said punchthrough stop is aligned with the width of said gate conductor.

5. The device of claim 3, further comprising a distribution of boron in said second argon doped silicon epitaxial layer, wherein a peak concentration of said distribution is proximate said upper surface of said second argon doped silicon epitaxial layer.

6. The device of claim 3, wherein said punchthrough stop comprises an n-type dopant.

7. The device of claim 3, wherein said punchthrough stop is located within said second argon doped silicon epitaxial layer.

8. The device of claim 2, wherein said gate conductor is arranged a dielectric spaced distance above said argon doped silicon epitaxial layer.

9. The device of claim 1, wherein said first argon concentration is different from said second argon concentration.

10. The device of claim 1, wherein said first argon concentration is greater than said second argon concentration.

11. The device of claim 2, wherein an upper surface of said well coincides with an upper surface of said second argon doped silicon epitaxial layer.

12. The device of claim 11, wherein a lower surface of said well extends to a lower surface of said first argon doped silicon epitaxial layer.

13. The device of claim 11, wherein a lower surface of said well extends into said first argon doped silicon epitaxial layer, and wherein said lower surface of said well resides above a lower surface of said first argon doped silicon epitaxial layer.

14. The device of claim 11, wherein a lower surface of said well resides exclusively within said second argon doped silicon epitaxial layer.

\* \* \* \* \*